US010211356B2

(12) United States Patent
Atchley

(10) Patent No.: US 10,211,356 B2
(45) Date of Patent: Feb. 19, 2019

(54) CELL INTERCONNECTS

(71) Applicant: SolarCity Corporation, San Mateo, CA (US)

(72) Inventor: Brian Atchley, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 299 days.

(21) Appl. No.: 14/998,384

(22) Filed: Dec. 23, 2015

(65) Prior Publication Data

US 2017/0186897 A1    Jun. 29, 2017

(51) Int. Cl.
*H01L 31/05* (2014.01)
*H02S 40/36* (2014.01)

(52) U.S. Cl.
CPC ......... *H01L 31/0508* (2013.01); *H02S 40/36* (2014.12)

(58) Field of Classification Search
CPC ..... H01L 31/00; H01L 31/02; H01L 31/0224; H01L 31/05; H01L 31/0504; H01L 31/0508; H01L 31/02002; H01L 31/02008; H01L 31/0201; H02S 40/36
See application file for complete search history.

(56) References Cited

U.S. PATENT DOCUMENTS

2011/0284052 A1\* 11/2011 Croft .................... H01L 31/042
                                                136/244
2015/0270410 A1    9/2015 Heng et al.
2015/0349703 A1\* 12/2015 Morad .................... H01L 31/05
                                                136/251

\* cited by examiner

*Primary Examiner* — Christina Chern
(74) *Attorney, Agent, or Firm* — Kilpatrick Townsend & Stockton LLP

(57) ABSTRACT

Flexible interconnects for attaching overlapping strings that can be part of a photovoltaic module. The interconnects can absorb strain caused by non-uniform heating and other loads encountered by the photovoltaic module.

2 Claims, 7 Drawing Sheets

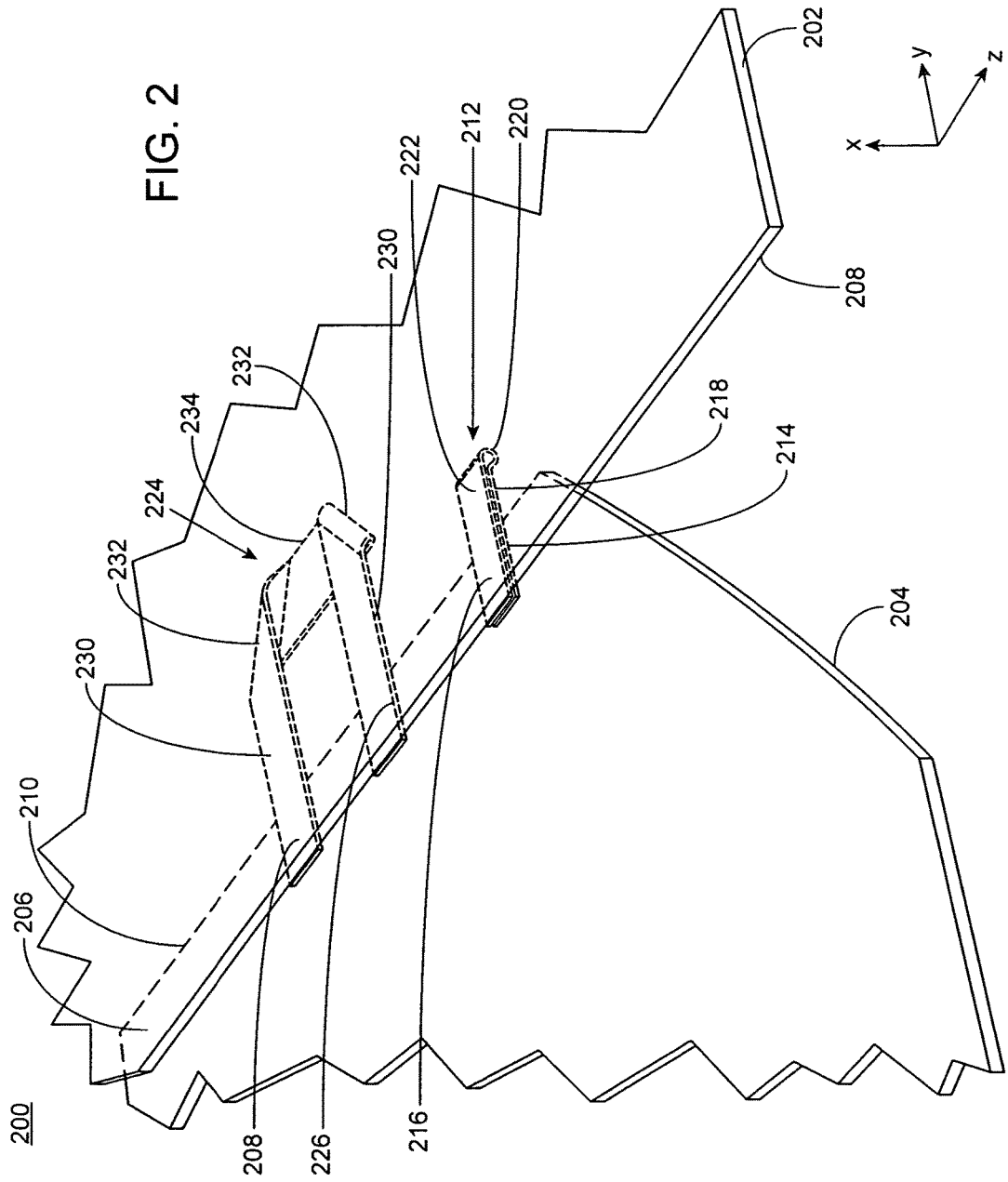

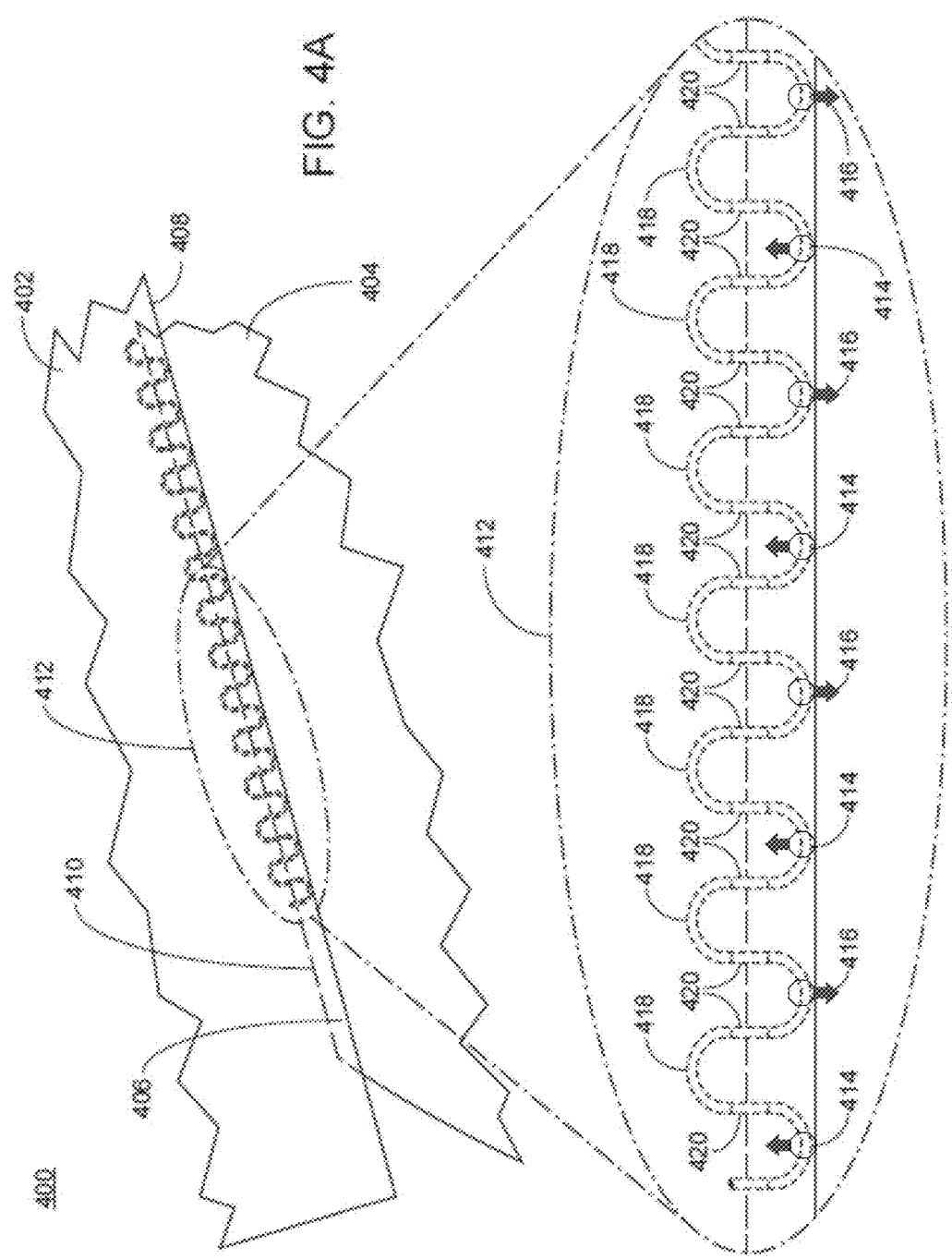

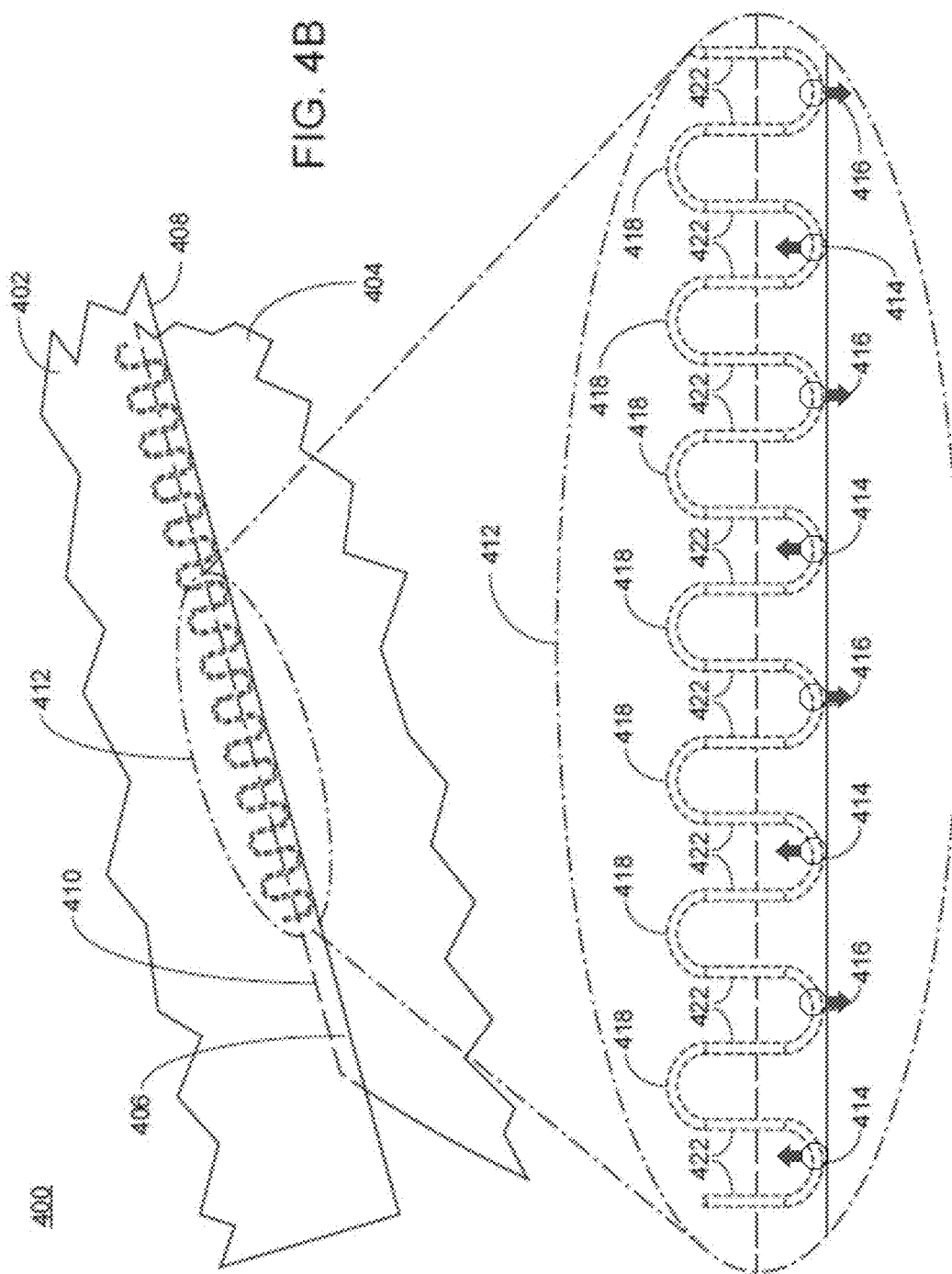

CELL INTERCONNECTS

BACKGROUND

Solar panels typically include one or more strings of solar cells. Adjacent solar cells in a string may overlap one another in a cascading arrangement. For example, continuous strings of solar cells that form a solar panel are described in U.S. patent application Ser. No. 14/510,008, filed Oct. 8, 2014, and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of solar cells that can fit into a solar panel.

One method of making such a panel includes sequentially connecting the busbars of adjacent cells and combining them. One type of panel (as described in the above-noted patent application) includes a series of cascaded strips created by dividing complete solar cells into strips, and then cascading the strips to form one or more strings.

In some environments, photovoltaic (PV) modules exhibit great strain due to effects of heating, and in particular effects of heating components, such as copper busbars, that have a disparate coefficient of expansion in comparison to other components. This strain can be exacerbated by non-uniform heating of the PV module, often caused by partial sun shading of the PV panel. These heating effects can result in non-uniform cyclical loading onto joints of a strip, resulting in premature failure of joints.

SUMMARY

To address the issues noted above, strips can be assembled using flexible interconnects that can absorb movement of strips. These interconnects can be arranged between strips and can be connected at edges of the strips. The strips can be arranged to overlap only at their edges. The interconnects can be flexible and for example, take the form of a ribbon, wire, several wires, and specialized shapes formed from foil. The interconnect can have one more folds or bends to facilitate strain absorption and flexibility.

A flexible interconnect can be connected at one portion to only a first strip and at a second portion only to a second strip. Movement of one strip can cause the ribbon to move between the connected portions, but not transfer significant force to the other strip. Accordingly, the interconnect can compensate for strain within a PV module cause by, for example, non-uniform heating of the module.

BRIEF DESCRIPTION OF THE DRAWINGS

FIGS. 2-5 show perspective views of various types of flexible interconnects between strips, according to some embodiments of the invention.

DETAILED DESCRIPTION

The following description is intended to convey a thorough understanding of the embodiments described by providing a number of specific embodiments and details involving flexible interconnects for strings. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

Figure 1A:
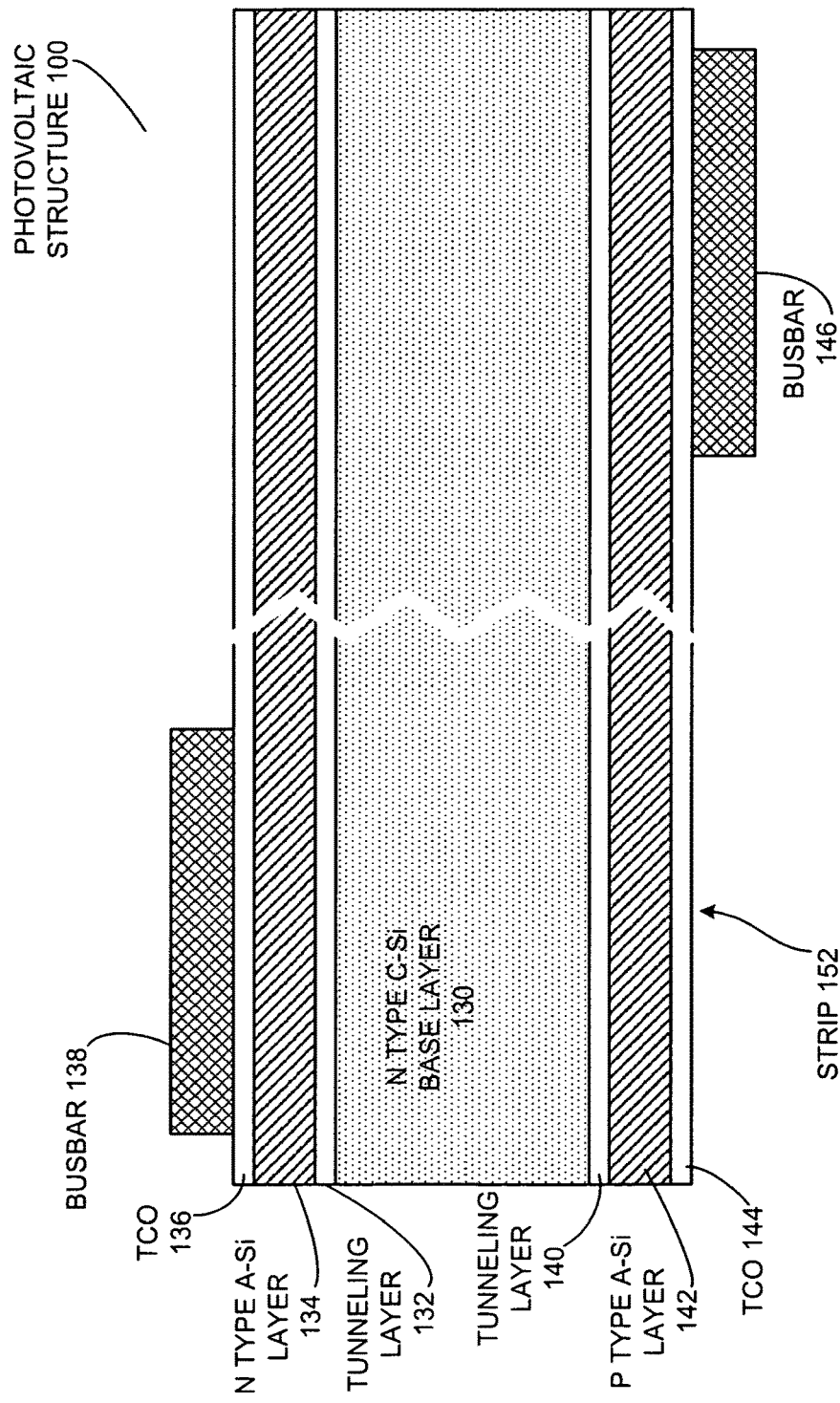
FIGS. 1A and 1B respectively show cross-sectional and top views of photovoltaic structures, according to some embodiments of the invention.

FIG. 1A shows one example of a photovoltaic structure. Photovoltaic structure 100 in this example can include N type lightly doped crystalline silicon (c-Si) base layer 130, intrinsic tunneling layer 132, N type heavily doped amorphous silicon (a-Si) surface field layer 134, transparent conductive oxide (TCO) layer 136, and front-side busbar 138. On the backside, the structure can include intrinsic tunneling layer 140, P type a-Si emitter layer 142, TCO layer 144, and backside busbar 146. The backside tunneling junction, formed by P type a-Si emitter layer 140, intrinsic tunneling layer 140, and N type c-Si base layer 130, can transport away the majority carriers generated by base layer 130. The front side tunneling junction, formed by N type heavily doped a-Si surface field layer 134, intrinsic tunneling layer 132, and base layer 130, can transport away the minority carriers generated by base layer 130, thereby reducing the amount of carrier recombination in base layer 130. Tunneling layers 132 and 140 can passivate the interface between base layer 130 and the two heavily doped a-Si layers while still allowing carriers generated by base layer 130 to enter these a-Si layers due to tunneling effect.

Some conventional solar panels include a single string of serially connected un-cleaved photovoltaic structures. As described in U.S. patent application Ser. No. 14/563,867, which is incorporated by reference herein, it can be more desirable to have multiple (such as 3) strings, each string including cascaded strips, and connect these strings in parallel. Such a multiple-parallel-string panel configuration provides the same output voltage with a reduced internal resistance.

Figure 1B:
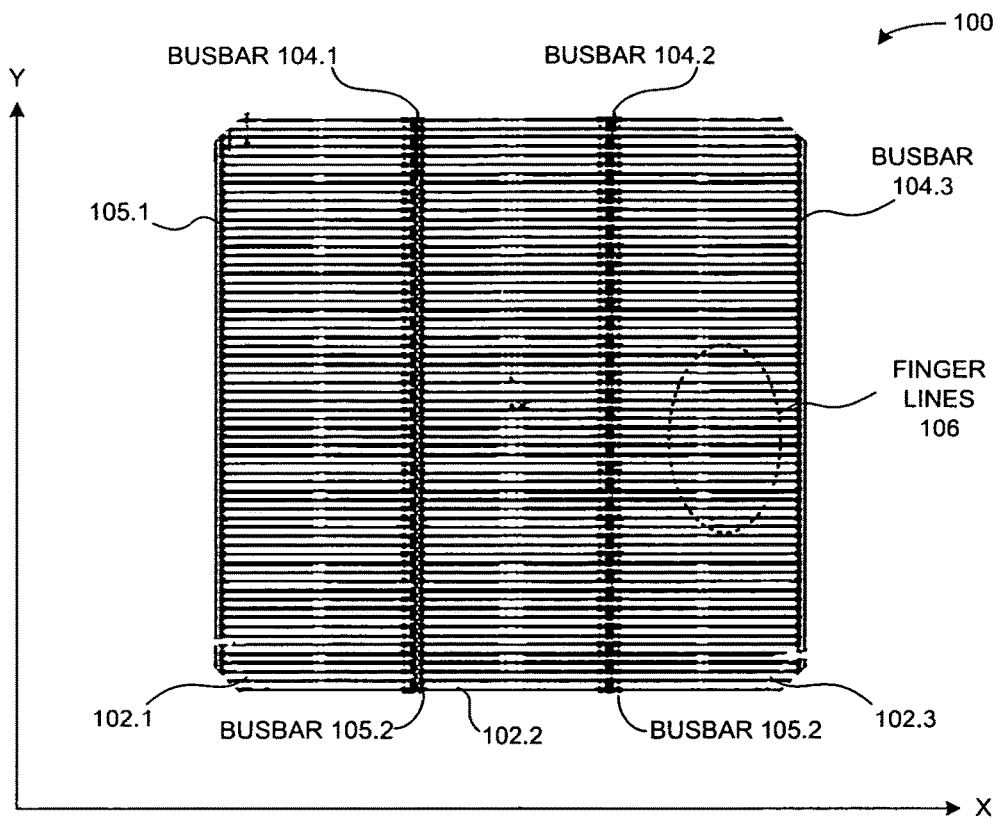

FIG. 1B shows photovoltaic structure 100 including three photovoltaic strips 102.1, 102.2, and 102.3, which can be the result of photovoltaic structure 100 having an electroplated copper electrode that exhibits low contact resistance. Each strip can include a number of substantially parallel finger lines, such as finger lines 106, arranged in the X direction. These finger lines can collect the carriers generated by the photovoltaic structure and allow them to move toward a busbar. The busbar can be any electrically conductive element such as a metallic strip, often wider than a finger line, arranged in the Y direction. The busbar then can aggregate the current collected by the finger lines. Each strip can include two busbars, one on each surface, positioned on opposite edges. For example, strip 102.1 can have busbar 204.1 on the top surface, and busbar 15.1 on the bottom surface. Similarly, strip 202.2 can have busbars 104.2 and 105.2 on the top and bottom surfaces, respectively, and strip 202.3 can have busbars 104.3 and 105.3 on the top and bottom surfaces, respectively.

Figure 1C:
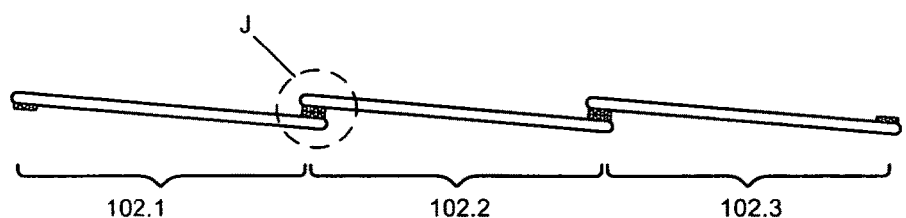
FIG. 1C shows a side view of a string constructed from strips, according to some embodiments of the invention.

FIG. 1C shows a cascaded arrangement of three strips assembled as a string. In this example, three strips 102.1, 102.2, and 102.3 can be arranged in a cascaded manner, such that the positive-side busbar of one strip overlaps and is electrically coupled to the negative-side busbar of the neighboring strip.

Often, assembly of a string is performed by adhering each busbar using a conductive adhesive, which is an effective method to assemble an efficient PV modules. However, in some environments, PV modules exhibit great strain due to effects of heating, and in particular effects of heating components, such as copper busbars, that have a disparate coefficient of expansion. This can be exacerbated by non-uniform heating of the PV modules, often caused by partial sun shading of the PV modules. These heating effects can result in cyclical loading onto joints J between busbars, resulting in cracking and eventual failure of the joint. Interconnects as disclosed herein can alleviate these effects.

FIG. 2 shows a perspective view of a portion of string 200. String 200 includes first strip 202 overlaying second strip 204. Each strip can be a portion or segment of a photovoltaic structure, such as a solar cell. A solar cell may be divided into a number of strips. A strip may have any shape and any size. The width and length of a strip may be the same or different from each other.

First strip 202 overlays second strip 204 within overlay portion 206. Overlay portion 206 can serve as an area for both physical and electrical connection between first strip 202 and second strip 204. Overlay portion 206 can be bounded between first strip edge 208 and second strip edge 210, and can include portions of busbars of each first strip 202 and second strip 204.

Interconnect 212 provides a mechanical and electrical interconnection between first strip 202 and second strip 204. Lower interconnection portion 214 electrically and mechanically connects to a busbar portion of second strip 204, but in some cases is not mechanically connected to first strip 204. Upper interconnection portion 216 electrically and mechanically connects to a busbar portion of first strip 202, but in some cases is not mechanically connected to second strip 204.

The lower and upper connection portions can be electrically and mechanically connected to the strips by soldered joints, weld joints, or by use of conductive adhesive. Portions of interconnect 212 can be masked with a material, e.g., polyimide film, to prevent such portions from adhering to busbars during soldering in a reflow oven. Soldering can be accomplished by many different methods, including inductive heating, air/convective heating, conductive heating.

Low temperature solders can be used to form the joints. Such solders can include alloys like Bismuth (e.g. Bismuth-Tin (BiSn)) to reduce melting temperature as compared to conventional solders. Low temperature solders can have reflow or relatively low melt temperatures around 140° C., whereas typical silver solders melt at 180° C. and greater. By lowering the melt temperature to within the range of lamination temperatures it can be possible to produce a PV module with fewer steps.

The use of low temperature solders can allow the assembly of a PV module in essentially one step, including formation of strings. In practice, this can be achieved by layering strips as strings between laminates (such as a back sheet or glass sheet). The strips can have interconnects as disclosed herein with low temperature solder paste on connection surfaces of the interconnects and busbars of the strips. Hence, increasing temperature of this arrangement will cause the low temperature solder to reflow and form permanent electrical and mechanical connections.

In addition, the laminate surfaces can include layers of heat cured adhesive, which cure at approximately the same temperature as the low temperature solder. Thus, all of the major parts of the PV module can be stacked and heated to simultaneously melt the solder and cure the encapsulate using a single heating step. Traditionally, an ethylene-vinyl acetate (EVA) adhesive is used to form laminates. However, in some cases, such adhesives may not be compatible with solder fluxes of low-temperature solders. In some embodiments, ionomer encapsulates, such as PV5400 sheets by Dupont, can be used in lieu of or in conjunction with traditional adhesives because ionomer encapsulates can be resistant to fluxes used in low temperature solders.

Interconnect 212 includes an elongated lower portion 218 that extends from lower interconnection portion 214 to fold 220. Elongated upper portion 222 extends between fold 220 and upper interconnection portion 216. FIG. 2 shows interconnect 212 configured as a flat ribbon of an electrically conductive material. However, other configurations of material are possible, such as a strand or wire, in a braided or solid configuration.

Interconnect 212 can be folded back upon itself to form fold 220. Hence, lower interconnection portion 214/elongated lower portion 218 can respectively contact upper interconnection portion 216/elongated upper portion 222, albeit in a floating manner such that these upper and lower portions are not mechanically connected to one another. This can provide flexibility in the X, Y, and Z directions between first strip 202 and second strip 204, such that forces applied to second strip 204 by first strip 202, as well as forces applied to first strip 202 by second strip 204, are mitigated by interconnect 212. Often, such forces are caused by thermal expansion of one or more portions of an associated PV module.

While FIG. 2 shows only one of interconnect 212, more than one interconnect 212 can be used to connect first strip 202 and second strip 204. Further, one or more of interconnect 212 can be located at locations of first strip 202 and second strip 204 that experience a particular amount of strain, and used in conjunction with portions of directly connected joints, such as conductive adhesive joints between first strip 202 and second strip 204, that experience lesser strain. In addition, interconnect 212 can be used in conjunction with other types of interconnects, including, but not limited to, any of the other types of interconnects disclosed herein.

FIG. 2 also shows interconnect 224 adjacent to interconnect 212. Although these interconnects can be used side-by-side, placement is shown only for economy of this disclosure. Interconnect 224 provides a mechanical and electrical interconnection between first strip 202 and second strip 204. First interconnection portion 226 electrically and mechanically connects to a busbar portion of first strip 202, but in some cases is not mechanically connected to second strip 204. Second interconnection portion 228 electrically and mechanically connects to a busbar portion of second strip 204, but in some cases is not mechanically connected to first strip 202.

The connection portions can be electrically and mechanically connected to the strips by soldered joints, weld joints, or by use of conductive adhesive. Portions of interconnect 224 can be masked with a material, e.g., polyimide film, to prevent such portions from adhering to busbars during soldering in a reflow oven. Soldering can be accomplished by many different methods, including inductive heating, air/convective heating, conductive heating.

Interconnect 224 includes elongated portions 230 that each can extend from first interconnection portion 226 and second interconnection portion 228 to folds 232. Intermediary portion 234 can extend between folds 232. FIG. 2 shows interconnect 224 configured as a flat ribbon of an electrically conductive material. However, other configurations of material are possible, such as a strand or wire, in a braided or solid configuration. Further, while folds 232 are shown to be symmetrical, folds 232 can also be configured in an asymmetrical pattern. And while two folds are shown, more than two folds can be used, as well as series of closely arranged folds, e.g., folds arranged in accordion patterns. Interconnect 224 can also be constructed from a single sheet of material formed with no folds, e.g., die or laser cut from foil, and include reliefs or other features to promote flexibility.

While FIG. 2 shows only one of interconnect 224, more than one interconnect 224 can be used to connect first strip 202 and second strip 204. Further, one or more of interconnect 224 can be located at locations of first strip 202 and second strip 204 that experience a particular amount of strain, and used in conjunction with portions of directly connected joints, such as conductive adhesive joints between first strip 202 and second strip 204, that experience lesser strain. In addition, interconnect 224 can be used in conjunction with other types of interconnects, including, but not limited to, any of the other types of interconnects disclosed herein.

Figure 3:
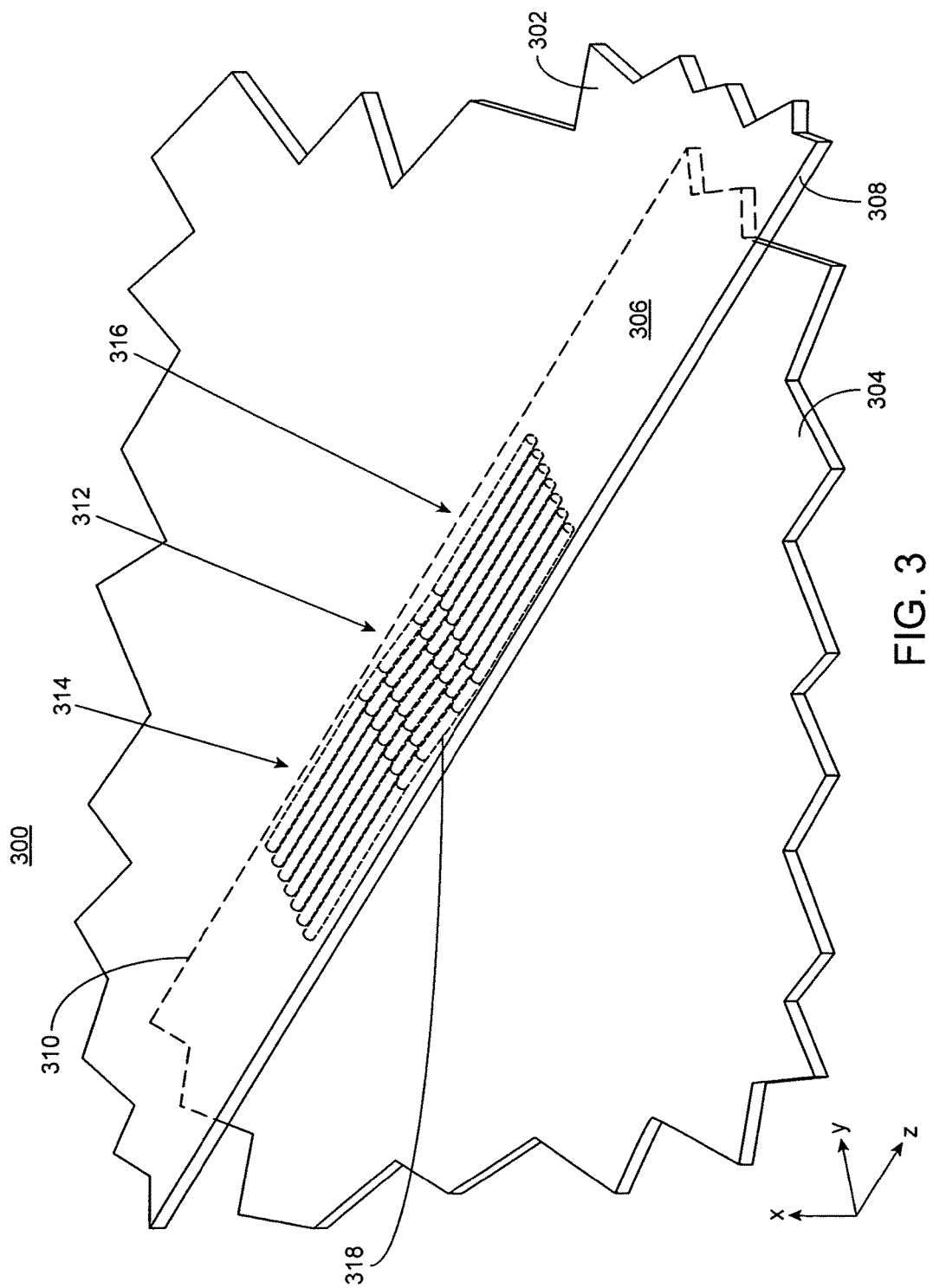

FIG. 3 shows a perspective view of a portion of string 300. String 300 can include first strip 302 overlaying second strip 304. Each strip can be a portion or segment of a photovoltaic structure, such as a solar cell. A solar cell may be divided into a number of strips. A strip may have any shape and any size. The width and length of a strip may be the same or different from each other.

First strip 302 overlays second strip 304 within overlay portion 306. Overlay portion 306 can serve as an area for both physical and electrical connection between first strip 302 and second strip 304. Overlay portion 306 can be bounded between first strip edge 308 and second strip edge 310, and can include portions of busbars of each first strip 302 and second strip 304.

Interconnect 312 provides a mechanical and electrical interconnection between first strip 302 and second strip 304. First interconnection portion 314 electrically and mechanically connects to a busbar portion of first strip 302, but in some cases is not directly mechanically connected to second strip 304. Second interconnection portion 316 electrically and mechanically connects to a busbar portion of second strip 304, but in some cases is not directly mechanically connected to first strip 302. The first and second connection portions can be electrically and mechanically connected to the strips by soldered joints, weld joints, or by use of conductive adhesive.

Interconnect 312 can include an elongated middle portion 318 that extends from first interconnection portion 314 to second interconnection portion 316. Elongated middle portion 318 may in some cases be not directly connected to either strip, and therefore can provide flexibility between the first interconnection portion 314 to second interconnection portion 316, to alleviate strain between the strips. Thus, interconnect 312 can provide flexibility in the X, Y, and Z directions between first strip 302 and second strip 304, such that forces applied to second strip 304 by first strip 302, as well as forces applied to first strip 302 by second strip 304, are mitigated by flexure of elongated middle portion 318.

FIG. 3 shows interconnect 312 configured as a plurality of round wires of an electrically conductive material arranged in a side-by-side formation, in a braided or solid configuration. However, other configurations of material are possible, such as ribbon wire. Further, while interconnect 312 is shown constructed from a plurality of directly adjacent wires, in some embodiments, only one wire is used or a plurality of wires separated by gaps.

While FIG. 3 shows only one of interconnect 312, more than one interconnect 312 can be used to connect first strip 302 and second strip 304. Further, one or more of interconnect 312 can be located at locations of first strip 302 and second strip 304 that experience a particular amount of strain, and used in conjunction with portions of directly connected joints, such as conductive adhesive joints between first strip 302 and second strip 304, that experience lesser strain. In addition, interconnect 312 can be used in conjunction with other types of interconnects, including, but not limited to, any of the other types of interconnects disclosed herein.

FIG. 4A shows a perspective view of a portion of string 400. String 400 can include first strip 402 overlaying second strip 404. Each strip can be a portion or segment of a photovoltaic structure, such as a solar cell. A solar cell may be divided into a number of strips. A strip may have any shape and any size. The width and length of a strip may be the same or different from each other.

First strip 402 overlays second strip 404 within overlay portion 406. Overlay portion 406 can serve as an area for both physical and electrical connection between first strip 402 and second strip 404. Overlay portion 406 can be bounded between first strip edge 408 and second strip edge 410, and includes portions of busbars of each first strip 302 and second strip 404.

Interconnect 412 provides an elongated mechanical and electrical interconnection between first strip 402 and second strip 404. First interconnection portions 414 electrically and mechanically connects to a busbar portion of first strip 402, but in some cases is not directly mechanically connected to second strip 404. Second interconnection portion 416 electrically and mechanically connects to a busbar portion of second strip 404, but in some cases is not directly mechanically connected to first strip 402. The first and second connection portions can be electrically and mechanically connected to the strips by soldered joints, weld joints, or by use of conductive adhesive. Portions of interconnect 412 can be masked with a material, e.g., polyimide film, to prevent such portions from adhering to busbars during soldering in a reflow oven. Soldering can be accomplished by many different methods, including inductive heating, air/convective heating, conductive heating.

Interconnect 412 includes flexible portions 418 that each extend between first interconnection portions 414 and second interconnection portions 416. Flexible portions 418 in some cases may not be not directly mechanically connected to either strip and can extend laterally from overlay portion 416 at varying distances by elongated wire portions 420, and therefore can provide flexibility between first interconnection portions 414 and second interconnection portions 416, to alleviate strain between the strips. Thus, interconnect 412 provides flexibility in the X, Y, and Z directions between first strip 402 and second strip 404, such that forces applied to second strip 404 by first strip 402, as well as forces applied to first strip 402 by second strip 404, are mitigated by flexure of flexible portions 418.

Like flexible portions 418, elongated wire portions 420 in some cases may not be directly connected to either strip to provide flexibility between the strips. As mentioned above, elongated wire portions 420 can vary in length. For example, at the embodiment shown at FIG. 4B, which is substantially the same as the embodiment shown at FIG. 4A, elongated wire portions 422 are significantly longer than elongated wire portions 420, thus laterally extending flexible portions 418 father away from second strip edge 410. In some cases, this arrangement can provide more comparative flexibility than the arrangement shown at FIG. 4A.

FIGS. 4A and 4B show interconnect 412 configured as an elongated wire having alternating U-shaped curves formed from an electrically conductive material, in a braided or solid configuration. However, other configurations of material are possible, such as square or triangular shaped portions. The upper curves of interconnect 412 form the flexible portions 418, and the lower curves form the first interconnection portions 414 and second interconnection portions 416, which alternate. Thus, every other lower curve is one of the first interconnection portions 414 or second interconnection portions 416.

Interconnect 412 can extend fully between strip 402 and 404 along overlay portion 406, or only partially extend. While FIGS. 4A and 4B show only one of interconnect 412, more than one interconnect 412 can be used to connect first strip 402 and second strip 404. Further, one or more of interconnect 412 can be located at locations of first strip 402 and second strip 404 that experience a particular amount of strain, and used in conjunction with portions of directly connected joints, such as conductive adhesive joints between first strip 402 and second strip 404, that experience lesser strain. In addition, interconnect 412 can be used in conjunction with other types of interconnects, including, but not limited to, any of the other types of interconnects disclosed herein.

Figure 5:
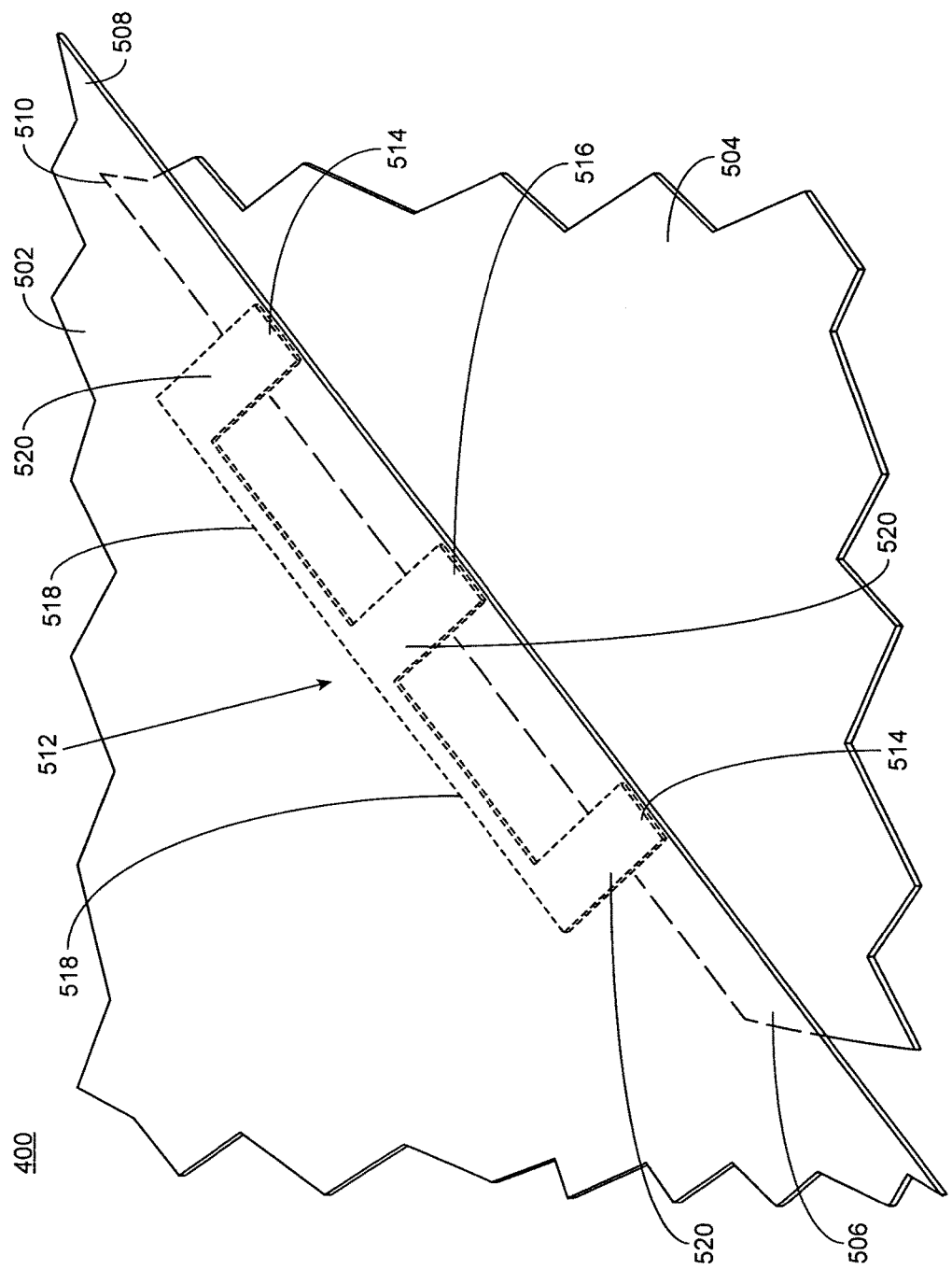

FIG. 5 shows a perspective view of a portion of string 500. String 500 includes first strip 502 overlaying second strip 504. Each strip can be a portion or segment of a photovoltaic structure, such as a solar cell. A solar cell may be divided into a number of strips. A strip may have any shape and any size. The width and length of a strip may be the same or different from each other.

First strip 502 can overlay second strip 504 within overlay portion 506. Overlay portion 506 can serve as an area for both physical and electrical connection between first strip 502 and second strip 504. Overlay portion 506 can be bounded between first strip edge 508 and second strip edge 510, and can include portions of busbars of each first strip 302 and second strip 504.

Interconnect 512 provides an elongated mechanical and electrical interconnection between first strip 502 and second strip 504. First interconnection portions 514 electrically and mechanically connects to a busbar portion of first strip 502, but in some cases is not directly mechanically connected to second strip 504. Second interconnection portion 516 electrically and mechanically connects to a busbar portion of second strip 404, but in some cases is not directly mechanically connected to first strip 502. The first and second connection portions can be electrically and mechanically connected to the strips by soldered joints, weld joints, or by use of conductive adhesive. Portions of interconnect 512 can be masked with a material, e.g., polyimide film, to prevent such portions from adhering to busbars during soldering in a reflow oven. Soldering can be accomplished by many different methods, including inductive heating, air/convective heating, conductive heating.

Interconnect 512 can include flexible portions 518 that each extend between first interconnection portions 514 and second interconnection portion 516. Flexible portions 518 may not always be directly connected to either strip and can extend laterally from overlay portion 506 at varying distances by elongated portions 520, and therefore can provide flexibility between first interconnection portions 514 and second interconnection portions 516, to alleviate strain between the strips. Thus, interconnect 512 can provide flexibility in the X, Y, and Z directions between first strip 502 and second strip 504, such that forces applied to second strip 504 by first strip 502, as well as forces applied to first strip 502 by second strip 504, are mitigated by flexure of flexible portions 518.

Like flexible portions 518, elongated portions 520 also are not directly connected to either strip. Elongated portions 520 can vary in length. For example, elongated portions 520 can be significantly longer shown, or alternate in length along the length of interconnect 512.

FIG. 5 shows interconnect 512 configured as an flat, planar sheet of material from an electrically conductive material, for example, die or laser cut from metal foil. In particular, first interconnection portions 514, second interconnection portions 516, and elongated portions 520 are depicted as contiguous lower rectangular tabs. Every other tab can form part of one of the first interconnection portions 414 or second interconnection portions 416. While only one of second interconnection portion 516 is depicted, a plurality of second interconnection portion 516 can be used, including arrangements with equal numbers of first interconnection portions 514 and second interconnection portions 516.

In addition, other configurations of the tabs are possible to tune flexibility and/or promote manufacturability, such as tabs that taper narrowly or increasingly in width towards flexible portions 518, and/or tabs including various cuts or openings along its length. Further, flexible portions 518 are depicted uniform elongated tabs, however, other variations are possible to tune flexibility and/or promote manufacturability. For example, flexible portions 518 can taper narrowly or increasingly in width between elongated portions 520, and/or flexible portions 518 can include various cuts or openings along its length.

Interconnect 512 can extend fully between strip 502 and 504 along overlay portion 506, or only partially. While FIG. 5 shows only one of interconnect 512, more than one interconnect 512 can be used to connect first strip 502 and second strip 504. Further, one or more of interconnect 512 can be located at locations of first strip 502 and second strip 504 that experience a particular amount of strain, and used in conjunction with portions of directly connected joints, such as conductive adhesive joints between first strip 502 and second strip 504, that experience lesser strain. In addition, interconnect 512 can be used in conjunction with other types of interconnects, including, but not limited to, any of the other types of interconnects disclosed herein.

The foregoing descriptions of embodiments of the invention have been presented for purposes of illustration and description only. They are not intended to be exhaustive or to limit the invention to the forms disclosed. Accordingly, many modifications and variations may be apparent to practitioners skilled in the art. Additionally, the above disclosure is not intended to limit the invention. The scope of the invention is defined by the appended claims.

What is claimed is:

1. A photovoltaic structure including a plurality of photovoltaic strips comprising:
    a first photovoltaic strip having a first strip edge portion;
    a second photovoltaic strip arranged in a cascade with the first photovoltaic strip, the second photovoltaic strip having a second strip edge portion positioned underneath the first strip edge portion; and
    an elongated interconnect having connection portions separated by flexible portions, the connection portions being electrically connected to the first and second strip edge portions, the flexible portions extending laterally outside of the first and second strip edge portions, wherein the elongated interconnect comprises a wire having a plurality of lower curves and a plurality of upper curves, each lower curve alternating and connecting with an upper curve, wherein the lower curves comprise the connection portions and the upper curves comprise the flexible portions, and wherein every other lower curve along the wire is electrically connected to the first strip edge portion, with the remaining plurality of lower curves being electrically connected to the second strip edge portion.

2. The cascade of photovoltaic strips of claim 1, wherein the plurality of lower curves and the plurality of upper curves are separated by a plurality of elongated wire portions.

* * * * *